US007606610B2

(12) United States Patent
Doyle

(10) Patent No.: US 7,606,610 B2
(45) Date of Patent: Oct. 20, 2009

(54) RAPID THREE-DIMENSIONAL MAGNETIC RESONANCE ANGIOGRAPHY

(75) Inventor: Mark Doyle, Wexford, PA (US)

(73) Assignee: Allegheny-Singer Research Institute, Pittsburgh, PA (US)

( * ) Notice: Subject to any disclaimer, the term of this patent is extended or adjusted under 35 U.S.C. 154(b) by 96 days.

(21) Appl. No.: 10/701,713

(22) Filed: Nov. 5, 2003

(65) Prior Publication Data

US 2005/0096533 A1    May 5, 2005

(51) Int. Cl.
    *A61B 5/05*  (2006.01)
(52) U.S. Cl. .................. 600/410; 600/407; 600/419; 324/306; 324/307; 324/309
(58) Field of Classification Search ......... 600/407–423; 324/306–309, 318–322
    See application file for complete search history.

(56) References Cited

U.S. PATENT DOCUMENTS 5,204,627 A * 4/1993 Mistretta et al. ............ 324/309
5,417,213 A * 5/1995 Prince ......................... 600/413
6,233,475 B1 * 5/2001 Kim et al. .................... 600/420
6,259,940 B1 * 7/2001 Bernstein et al. ............. 600/410
6,487,435 B2 * 11/2002 Mistretta et al. ............. 600/420
2003/0166999 A1 * 9/2003 Liu et al. ..................... 600/410
2003/0169043 A1 * 9/2003 Hoshino ...................... 324/318
2004/0254447 A1 * 12/2004 Block et al. ................. 600/410

* cited by examiner

*Primary Examiner*—Brian Casler
*Assistant Examiner*—John F. Ramirez
(74) *Attorney, Agent, or Firm*—Ansel M. Schwartz

(57) ABSTRACT

A method for imaging a patient. An apparatus for imaging a patient including a magnetic resonance imager having a controller and a memory in communication with the controller. The controller causes the imager to take a two-dimensional image of the patient which is stored in the memory. The controller identifying locations of interest of the k-space representation of the two-dimensional image, and acquiring a three-dimensional magnetic resonance angiography image based on the locations of interest of the two-dimensional k-space data set.

9 Claims, 3 Drawing Sheets

RAPID THREE-DIMENSIONAL MAGNETIC RESONANCE ANGIOGRAPHY

FIELD OF THE INVENTION

The present invention is related to reducing the scan time for acquiring three-dimensional magnetic resonance angiography (MRA) by approximately 90%. As is standard, a bolus of contrast agent is injected and is imaged as it passes through the vascular system. The new approach relies on acquisition of a reduced three-dimensional data set by using a "mask" to prospectively select data samples to be acquired. The mask information can be rapidly acquired using a two-dimensional acquisition. The two-dimensional mask and three-dimensional data can be acquired in rapid succession, allowing the mask information to adapt to the changing conditions as the contrast bolus passes through the vascular system.

BACKGROUND OF THE INVENTION

MRA is a widely performed clinical diagnostic procedure and is rapidly replacing x-ray based methods of angiography. If the speed with which MRA data could be increased, then clinical utility would be extended to include time resolved angiograms that could be used to make additional diagnoses.

Currently, three-dimensional angiography acquisitions take about 30 seconds to complete. During this time, a bolus injection of contrast agent has to be imaged as it passes through the vascular system. In an attempt to capture the contrast as it first enters the arterial system, commercial scanners use "centric coding". In this process, the central regions of the three-dimensional data acquisition are acquired first, followed by the outer regions of the three-dimensional data set. This approach helps capture the early contrast conditions but the disadvantage is that it still requires acquisition of the full three-dimensional data set to complete the scan. Another approach is only to acquire the central data of the three-dimensional data set (in the k-space domain), and while this rapidly captures the contrast conditions, the resolution of the data set is reduced. The centric approaches can reduce the scan time by about 75%. A third technique uses an approach developed by the inventor, to distribute the acquisition of spatial data in such a manner as to sparsely sample data and use interpolation of the time dimension to retrospectively fill in the data. The disadvantage of this technique is that it is very susceptible to breathing motion, which causes artifact.

The present invention uses a data mask to guide the acquisition of three-dimensional data. The advantage of this approach is that it allows data to be acquired to capture contrast information with high-resolution detail. The acquisition requires rapidly acquiring a two-dimensional data set and processing this data by thresholding to guide the subsequent three-dimensional data set. The additional processing requires an additional step in the scanner.

SUMMARY OF THE INVENTION

The present invention pertains to an apparatus for imaging a patient. The apparatus comprises a magnetic resonance imager having a controller and a memory in communication with the controller. The controller causes the imager to take a two-dimensional k-space data set of the patient which is stored in the memory. The controller identifying locations of interest of k-space data set in the two-dimensional representation, and acquiring a three-dimensional magnetic resonance angiogram data set based on the locations of interest of the two-dimensional data set.

The present invention pertains to a method for imaging a patient. The method comprises the steps of taking a two-dimensional image of the patient. There is the step of identifying locations of interest of the two-dimensional data set. There is the step of acquiring a three-dimensional MRA data set based on the signal locations identified in the two-dimensional data set.

BRIEF DESCRIPTION OF THE DRAWINGS

In the accompanying drawings, the preferred embodiment of the invention and preferred methods of practicing the invention are illustrated in which.

DETAILED DESCRIPTION

Figure 1:
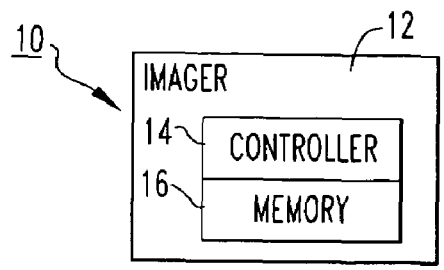
FIG. 1 is a schematic representation of an apparatus of the present invention.

Referring now to the drawings wherein like reference numerals refer to similar or identical parts throughout the several views, and more specifically to FIG. 1 thereof, there is shown an apparatus 10 for imaging a patient. The apparatus 10 comprises a magnetic resonance imager 12 having a controller 14 and a memory 16 in communication with the controller 14. The controller 14 causes the imager 12 to take a two-dimensional k-space data set of the patient which is stored in the memory 16. The controller 14 identifying locations of interest in the two-dimensional k-space data set, and acquiring a three-dimensional magnetic resonance angiography image based on the signal locations of interest identified in the two-dimensional k-space data set.

Preferably, the controller 14 forms a mask from the two-dimensional k-space data set to prospectively select data samples for the acquisition of the three-dimensional MRA k-space data set. The controller 14 preferably sets regions to zero of the two-dimensional k-space data set based on a predetermined threshold.

Preferably, the controller 14 uses the mask to guide three-dimensional acquisition of approximately 10 percent of the data normally required for a three-dimensional MRA image.

The present invention pertains to a method for imaging a patient. The method comprises the steps of taking a two-dimensional image of the k-space data set. There is the step of identifying locations of interest of the patient in the two-dimensional data set. There is the step of acquiring a three-dimensional MRA data set based on the locations of interest identified in the two-dimensional k-space data set.

Preferably, there is the step of forming a mask from the two-dimensional k-space data set to prospectively select data samples for the acquisition of the three-dimensional MRA image. There is preferably the step of repeating the taking, identifying, forming and acquiring steps. Preferably, the acquiring step includes the step of reducing scanning time for acquiring the three-dimensional MRA image by about 90 percent relative to a normal time it takes to acquire the MRA image. A normal time is about 30 seconds.

There is preferably the step of introducing a bolus of contrast agents into the patient, such as gadolinium contrast agent. Preferably, the forming step includes the step of setting regions to zero of the two-dimensional k-space image based on a predetermined threshold. The acquiring step preferably includes the step of using the mask to guide three-dimensional acquisition of approximately 10 percent of the data normally required for a three-dimensional MRA image. Data that is normally collected in a three-dimensional data set is every point in the three-dimensional k-space matrix filled with an individually sampled data point. Here, only about 10% of the points are sampled and the remainder of the points are set to zero. The idea being that the sampled points are the most significant ones, as guided by the two-dimensional masked data set.

Figure 2:
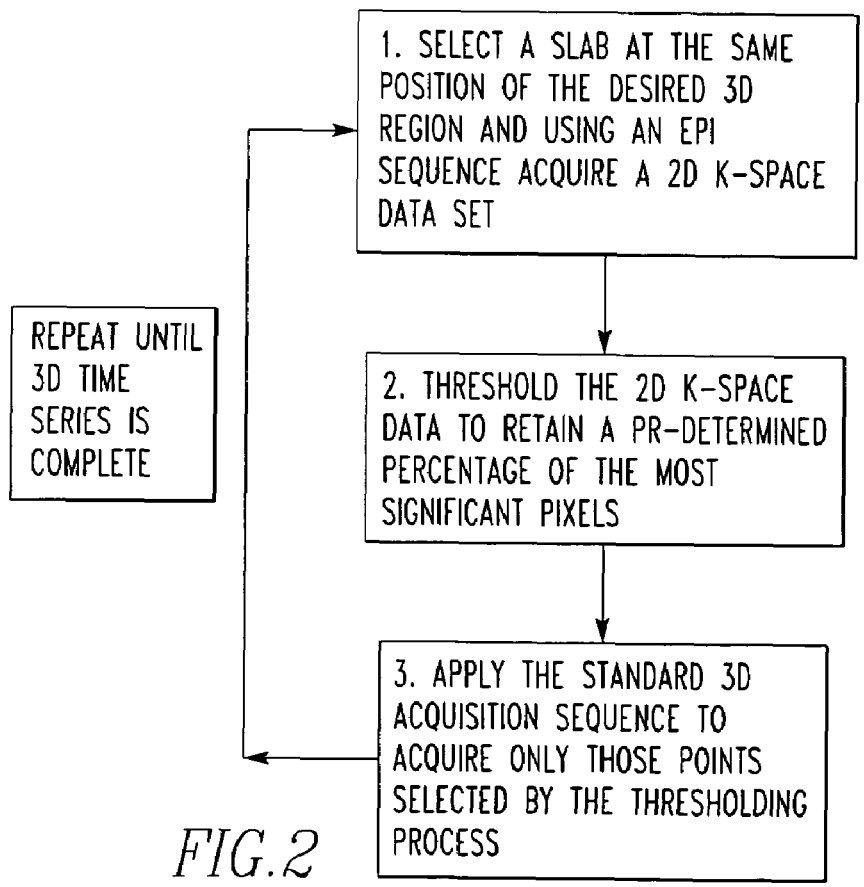
FIG. 2 is a flow chart regarding acquisition of the present invention.
Figure 4:
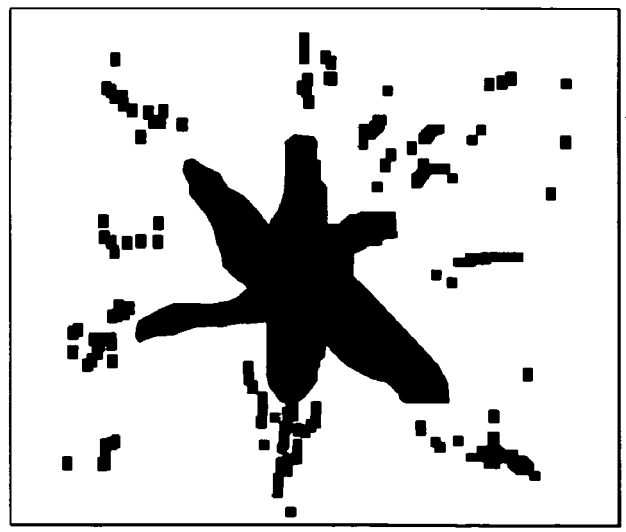
FIG. 4 shows k-space data in two-dimensional space.
Figure 6:
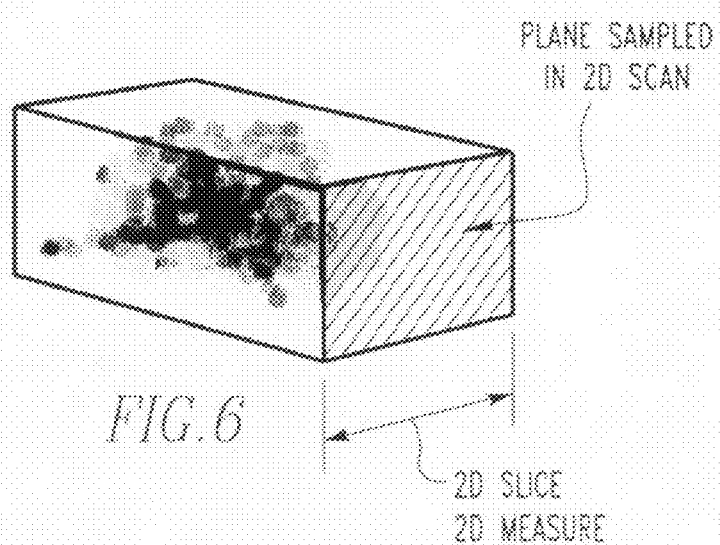
FIG. 6 shows the plane sampled for the two-dimensional scan indicated in FIG. 2.

In the operation of the preferred embodiment, and referring to FIG. 2 and FIG. 6, the three-dimensional acquisition begins with the first step of selecting a slab at the same position of the desired three-dimensional region and using an EPI sequence to acquire a two-dimensional k-space data set, as more fully detailed in "Slice Selection", Garroway and Grannell, J. Phys. C, 7, L457, 1974. The second step is to threshold the two-dimensional k-space data to retain a predetermined percentage of the most significant pixels. The third step is to apply the standard three-dimensional acquisition sequence to acquire only those points selected by the thresholding process to form a mask, as shown in FIG. 4. These three steps are repeated until the three-dimensional time series is complete.

Figure 3:
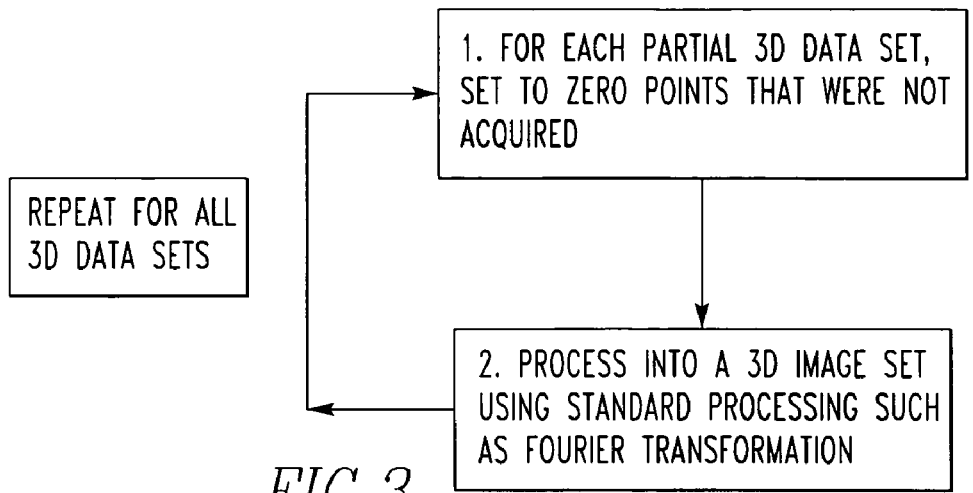
FIG. 3 is a flow chart regarding data processing of the present invention.
Figure 5:
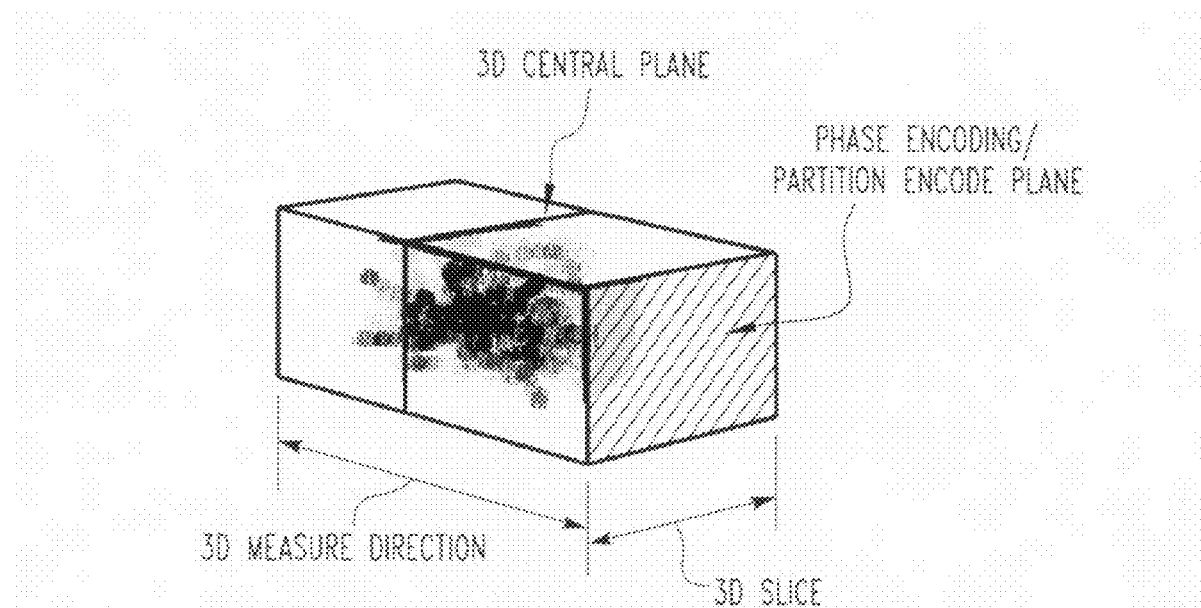
FIG. 5 shows k-space data in three-dimensional space.

The three-dimensional data processing begins with the first step that for each partial three-dimensional data set, set to zero the points that were not acquired, as shown in FIG. 3 and FIG. 5. The second step is to process into a three-dimensional Image set all the partial three-dimensional data sets using standard processing such as Fourier Transformation. See P. Mansfield and P. G. Morris, "NMR Imaging in Biomedicine", Aca-de-mic Press, New York, 1982.

Although the invention has been described in detail in the foregoing embodiments for the purpose of illustration, it is to be understood that such detail is solely for that purpose and that variations can be made therein by those skilled in the art without departing from the spirit and scope of the invention except as it may be described by the following claims.

What is claimed is:

1. A method for imaging a vascular system of a patient comprising the steps of:
    introducing a bolus of contrast agent into the patient;
    selecting a slab at a position of a desired three-dimensional region and using an EPI sequence to acquire a two-dimensional k-space data set;
    taking a two-dimensional k-space data set of the patient at a same position of the desired three-dimensional region;
    thresholding the two-dimensional k-space data to retain a predetermined percentage of pixels;
    identifying locations of interest of the patient in the two-dimensional k-space;
    applying a three-dimensional acquisition sequence to acquire only those points selected by the thresholding step to form a mask;
    forming a mask from the two-dimensional k-space image to prospectively select data samples for the acquisition of three-dimensional MRA data set of the locations of interest;
    acquiring a three-dimensional MRA data set of the locations of interest of the two-dimensional k-space data set of the selected data samples; and
    imaging the contrast agent from the three-dimensional MRA as it passes through the vascular system of the patient.

2. A method as described in claim 1 including the step of repeating the taking, identifying, forming and acquiring steps.

3. A method as described in claim 2 wherein the forming step includes the step of setting regions to zero of the two-dimensional k-space data set based on a predetermined threshold.

4. A method as described in claim 3 wherein the acquiring step includes the step of using the mask to guide three-dimensional acquisition of approximately 10 percent of the data normally required for a three-dimensional MRA data set.

5. An apparatus for imaging a patient comprising:
    a bolus of contrast agent for introduction into the patient;
    a magnetic resonance imager having a controller and a memory in communication with the controller, the controller selecting a slab at a position of a desired three-dimensional region and using an EPI sequence to acquire a two-dimensional k-space data set, the controller causing the imager to take a two-dimensional k-space data set of the patient at a same position of the three-dimensional region which is stored in the memory, the controller identifying locations of interest of the patient, including tissue and moving blood, in the two-dimensional k-space data set, forming a mask from the two-dimensional k-space image to prospectively select data samples for the acquisition of three-dimensional MRA data set of the locations of interest, acquiring a three-dimensional magnetic resonance angiography data set of the locations of interest of the two-dimensional k-space data set of the selected data sample; and imaging the contrast agent from the three-dimensional MRA as it passes through the vascular system of the patient.

6. An apparatus as described in claim 5 wherein the controller forms a mask from the two-dimensional k-space data set to prospectively select data samples for the acquisition of the three-dimensional MRA data set.

7. An apparatus as described in claim 6 wherein the controller sets regions to zero of the two-dimensional k-space data set based on a predetermined threshold.

8. A method for imaging a patient comprising the steps of:
    introducing a bolus of contrast agent into the patient;
    selecting a slab at a position of a desired three-dimensional region and using an EPI sequence to acquire a two-dimensional k-space data set;
    taking a two-dimensional k-space data set of the patient at a same position of the three-dimensional region;
    identifying locations of interest of the patient in the two-dimensional k-space;
    forming a mask from the two-dimensional k-space image to prospectively select data samples for the acquisition of the three-dimensional MRA data set;
    acquiring a three-dimensional MRA data set based on the locations of interest of the two-dimensional k-space data set of the selected data samples, including the step of reducing scanning time for acquiring the three-dimensional MRA data set by about 90 percent relative to a normal time of about 30 seconds it takes to acquire the MRA image;
    imaging the contrast agent from the three-dimensional MRA as it passes through the vascular system of the patient; and
    repeating the taking, identifying, forming and acquiring steps.

9. An apparatus for imaging a patient comprising:
    a bolus of contrast agent for introduction into the patient; and a magnetic resonance imager having a controller and a memory in communication with the controller, selecting a slab at a position of a desired three-dimensional region and using an EPI sequence to acquire a two-dimensional k-space data set, the controller causing the imager to take a two-dimensional k-space data set of the patient at a same position of the three-dimensional region which is stored in the memory, the controller identifying locations of interest of the patient in the two-dimensional k-space data set, forming a mask from the two-dimensional k-space image to prospectively select data samples for the acquisition of three-dimensional MRA data set, acquiring a three-dimensional magnetic resonance angiography data set based on the locations of interest of the two-dimensional k-space data set of the selected data samples, the controller forms a mask from the two-dimensional k-space data set to prospectively select data samples for the acquisition of the three-dimensional MRA data set, the controller sets regions to zero of the two-dimensional k-space data set based on a predetermined threshold, the controller uses the mask to guide three-dimensional acquisition of approximately 10 percent of the data normally required for a three-dimensional MRA data set.

* * * * *